(12) United States Patent
Pillay et al.

(10) Patent No.: US 10,796,047 B2
(45) Date of Patent: Oct. 6, 2020

(54) FUNCTIONAL SAFETY SYNTHESIS

(71) Applicant: Mentor Graphics Corporation, Wilsonville, OR (US)

(72) Inventors: Sanjay Pillay, Aust, TX (US); Arum Kumar Gogineni, Cedar Park, TX (US); Srikanth Rengarajan, Austin, TX (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 16/254,324

(22) Filed: Jan. 22, 2019

(65) Prior Publication Data

US 2019/0228125 A1     Jul. 25, 2019

Related U.S. Application Data

(60) Provisional application No. 62/619,731, filed on Jan. 20, 2018, provisional application No. 62/624,826, filed on Feb. 1, 2018.

(51) Int. Cl.
*G06F 30/30* (2020.01)
*G06F 30/33* (2020.01)
*G06F 30/3323* (2020.01)

(52) U.S. Cl.
CPC .............. *G06F 30/33* (2020.01); *G06F 30/30* (2020.01); *G06F 30/3323* (2020.01)

(58) Field of Classification Search
CPC . G06F 17/5022; G06F 17/504; G06F 17/5045
USPC ........................................ 716/101, 106, 107
See application file for complete search history.

(56) References Cited

U.S. PATENT DOCUMENTS

| | | | | |
|---|---|---|---|---|
| 3,397,386 A | * | 8/1968 | Bishup et al. ............ | H04Q 9/14 340/870.07 |
| 4,707,795 A | * | 11/1987 | Alber et al. ........ | G01R 31/3648 702/63 |
| 5,001,713 A | * | 3/1991 | Whetsel ......... | G01R 31/318555 714/727 |
| 5,103,450 A | * | 4/1992 | Whetsel ......... | G01R 31/318555 714/724 |
| 5,253,255 A | * | 10/1993 | Carbine .............. | G06F 11/2236 714/30 |

(Continued)

*Primary Examiner* — Sun J Lin
(74) *Attorney, Agent, or Firm* — Mentor Graphics Corporation

(57) ABSTRACT

This application discloses a computing system implementing a functional safety validation tool to locate a vulnerable section of an electronic system described in a circuit design, select safety circuitry configured to monitor the vulnerable section of the electronic system, and modify the circuit design by inserting the safety circuitry and control circuitry into the circuit design. The control circuitry and the safety circuitry can detect faults in the vulnerable section of the electronic system. The functional safety validation tool can generate a logical equivalency check script for the modified circuit design, wherein a logical equivalency checking tool can be utilized to determine whether the modified circuit design is logically equivalent to the circuit design. The functional safety validation tool can generate a test bench for the modified circuit design, wherein at least one verification tool can be utilized in a verification environment to simulate the modified circuit design.

17 Claims, 6 Drawing Sheets

(56) References Cited

U.S. PATENT DOCUMENTS 6,009,256 A * 12/1999 Tseng .................... G06F 30/331
  703/13
2017/0324195 A1* 11/2017 Eriksen et al. .......... H02H 3/00

* cited by examiner

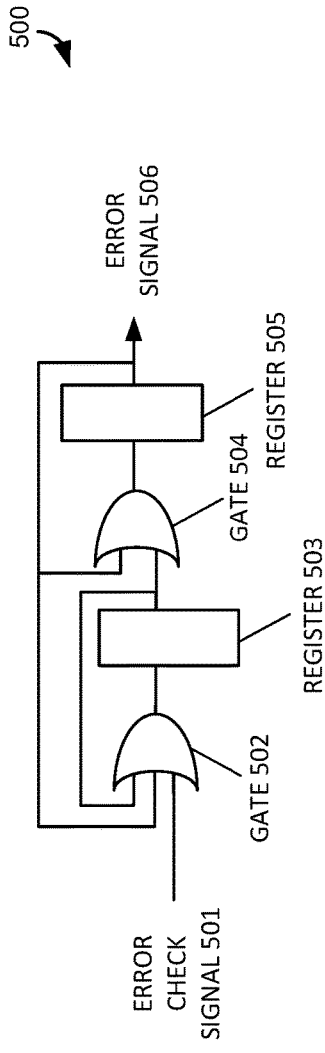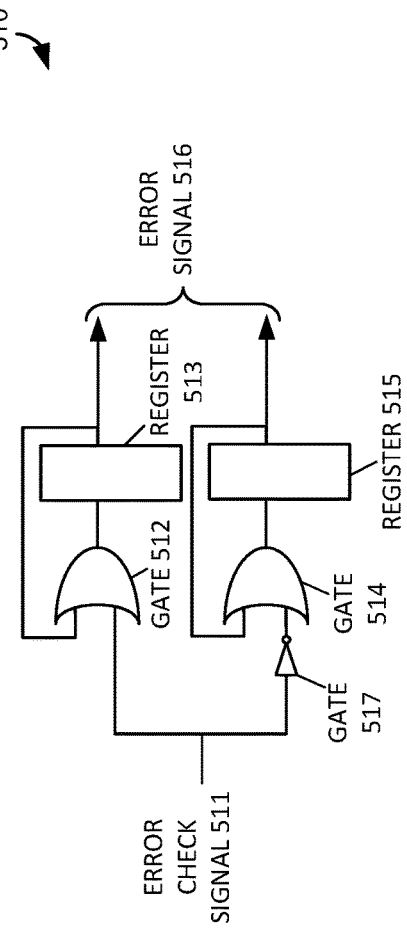

US 10,796,047 B2

FUNCTIONAL SAFETY SYNTHESIS

RELATED APPLICATION

This patent application claims priority to U.S. Provisional Patent Application No. 62/619,731, filed Jan. 20, 2018, and U.S. Provisional Patent Application No. 62/624,826, filed Feb. 1, 2018, both of which are incorporated by reference herein.

TECHNICAL FIELD

This application is generally related to electronic design automation and, more specifically, to synthesizing circuitry implementing functional safety into integrated circuit designs.

BACKGROUND

Designing and fabricating electronic systems typically involves many steps, known as a "design flow." The particular steps of a design flow often are dependent upon the type of electronic system to be manufactured, its complexity, the design team, and the fabricator or foundry that will manufacture the electronic system from a design. Typically, software and hardware "tools" verify the design at various stages of the design flow by running simulators and/or hardware emulators, or by utilizing formal techniques, allowing any errors in the design discovered during the verification process to be corrected.

Initially, a specification for a new electronic system can be transformed into a logical design, sometimes referred to as a register transfer level (RTL) description of the electronic system. With this logical design, the electronic system can be described in terms of both the exchange of signals between hardware registers and the logical operations that can be performed on those signals. The logical design typically employs a Hardware Design Language (HDL), such as System Verilog or Very high speed integrated circuit Hardware Design Language (VHDL).

The logic of the electronic system can be analyzed to confirm that it will accurately perform the functions desired for the electronic system, sometimes referred to as "functional verification." Design verification tools can perform functional verification operations, such as simulating, emulating, and/or formally verifying the logical design. For example, when a design verification tool simulates the logical design, the design verification tool can provide transactions or sets of test vectors, for example, generated by a simulated test bench, to the simulated logical design. The design verification tools can determine how the simulated logical design responded to the transactions or test vectors, and verify, from that response, that the logical design describes circuitry to accurately perform functions.

After functional verification, the logical design can be examined for potential failures in products or processes, sometimes referred to as "functional safety validation." Functional safety tools can perform Failure Mode and Effects Analysis (FMEA) to examine the logical design for potential failures and help select remedial actions that reduce cumulative impacts of life-cycle consequences or risks from a systems failure or fault. The FMEA can be used in conjunction with design and manufacturing processes, and has found many applications in the automotive, aerospace, biomedical and other safety critical or security related industries. The functional safety tools typically perform functional safety validation, such as FMEA or FMEDA, by utilizing gate level timing simulations on the logical designs to identify where the logical designs can include critical faults.

SUMMARY

This application discloses a computing system implementing a functional safety validation tool to locate a vulnerable section of an electronic system described in a circuit design, select safety circuitry configured to monitor the vulnerable section of the electronic system, and modify the circuit design by inserting the safety circuitry and control circuitry into the circuit design. The safety circuitry can include a parity generation and check circuitry, a state machine protocol check circuitry, an error-correcting code check circuitry, or replicated circuitry from the circuit design. The control circuitry and the security circuitry can detect faults in the vulnerable section of the electronic system. The functional safety validation tool can generate a logical equivalency check script for the modified circuit design, which a logical equivalency checking tool can utilize to determine whether the modified circuit design is logically equivalent to the circuit design. The functional safety validation tool can generate a test bench for the modified circuit design, which at least one verification tool can utilize in a verification environment to simulate the modified circuit design. Embodiments will be described in greater detail below.

DESCRIPTION OF THE DRAWINGS

FIGS. 5A and 5B illustrate example redundancy configurations for functional safety circuitry, which may be implemented according to various embodiments.

DETAILED DESCRIPTION

Illustrative Operating Environment

Figure 1:
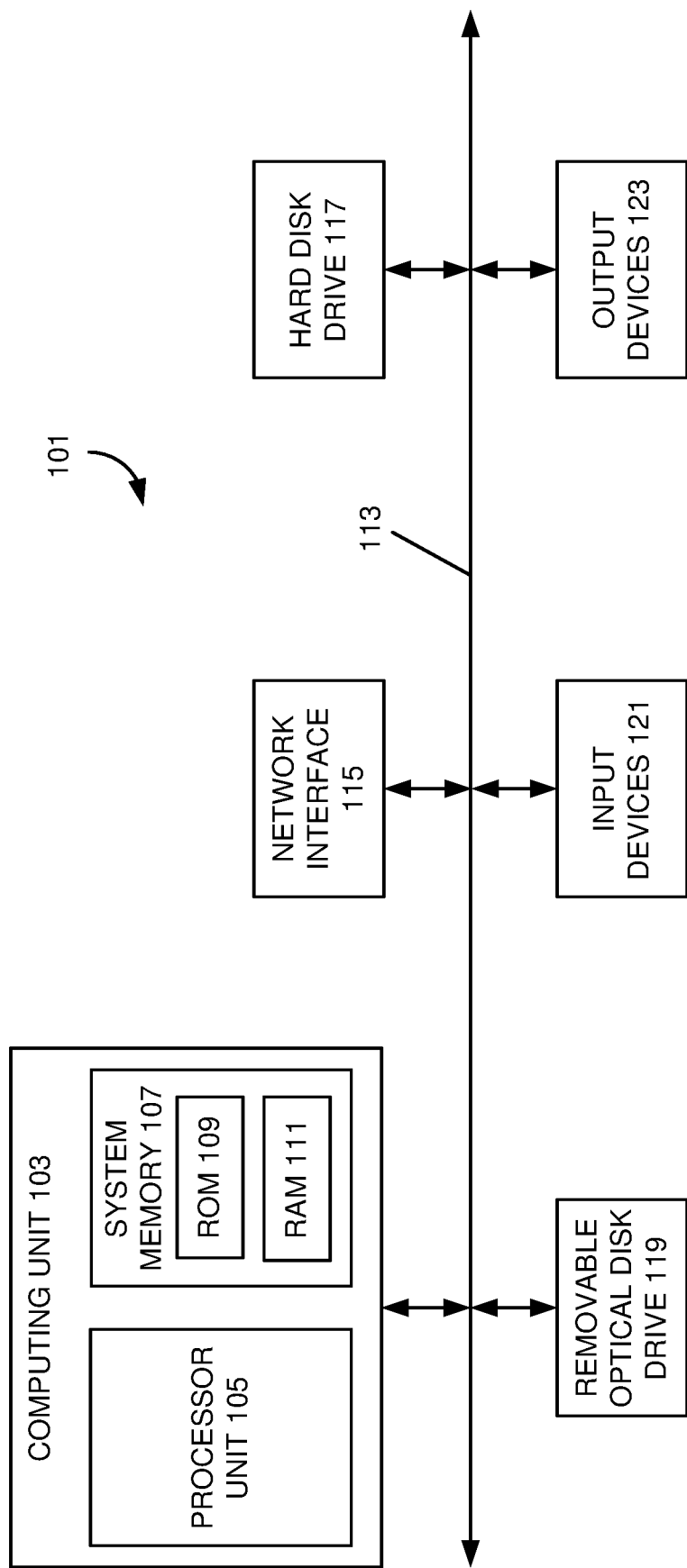
FIGS. 1 and 2 illustrate an example of a computer system of the type that may be used to implement various embodiments.

Various embodiments may be implemented through the execution of software instructions by a computing device 101, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices 117-123. For example, the processing unit 105 or the system memory 107 may be directly or indirectly connected to one or more additional memory storage devices, such as a hard disk drive 117, which can be magnetic and/or removable, a removable optical disk drive 119, and/or a flash memory card. The processing unit 105 and the system memory 107 also may be directly or indirectly connected to one or more input devices 121 and one or more output devices 123. The input devices 121 may include, for example, a keyboard, a pointing device (such as a mouse, touchpad, stylus, trackball, or joystick), a scanner, a camera, and a microphone. The output devices 123 may include, for example, a monitor display, a printer and speakers. With various examples of the computing device 101, one or more of the peripheral devices 117-123 may be internally housed with the computing unit 103. Alternately, one or more of the peripheral devices 117-123 may be external to the housing for the computing unit 103 and connected to the bus 113 through, for example, a Universal Serial Bus (USB) connection.

With some implementations, the computing unit 103 may be directly or indirectly connected to a network interface 115 for communicating with other devices making up a network. The network interface 115 can translate data and control signals from the computing unit 103 into network messages according to one or more communication protocols, such as the transmission control protocol (TCP) and the Internet protocol (IP). Also, the network interface 115 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 101 is illustrated as an example only, and it not intended to be limiting. Various embodiments may be implemented using one or more computing devices that include the components of the computing device 101 illustrated in FIG. 1, which include only a subset of the components illustrated in FIG. 1, or which include an alternate combination of components, including components that are not shown in FIG. 1. For example, various embodiments may be implemented using a multi-processor computer, a plurality of single and/or multiprocessor computers arranged into a network, or some combination of both.

Figure 2:
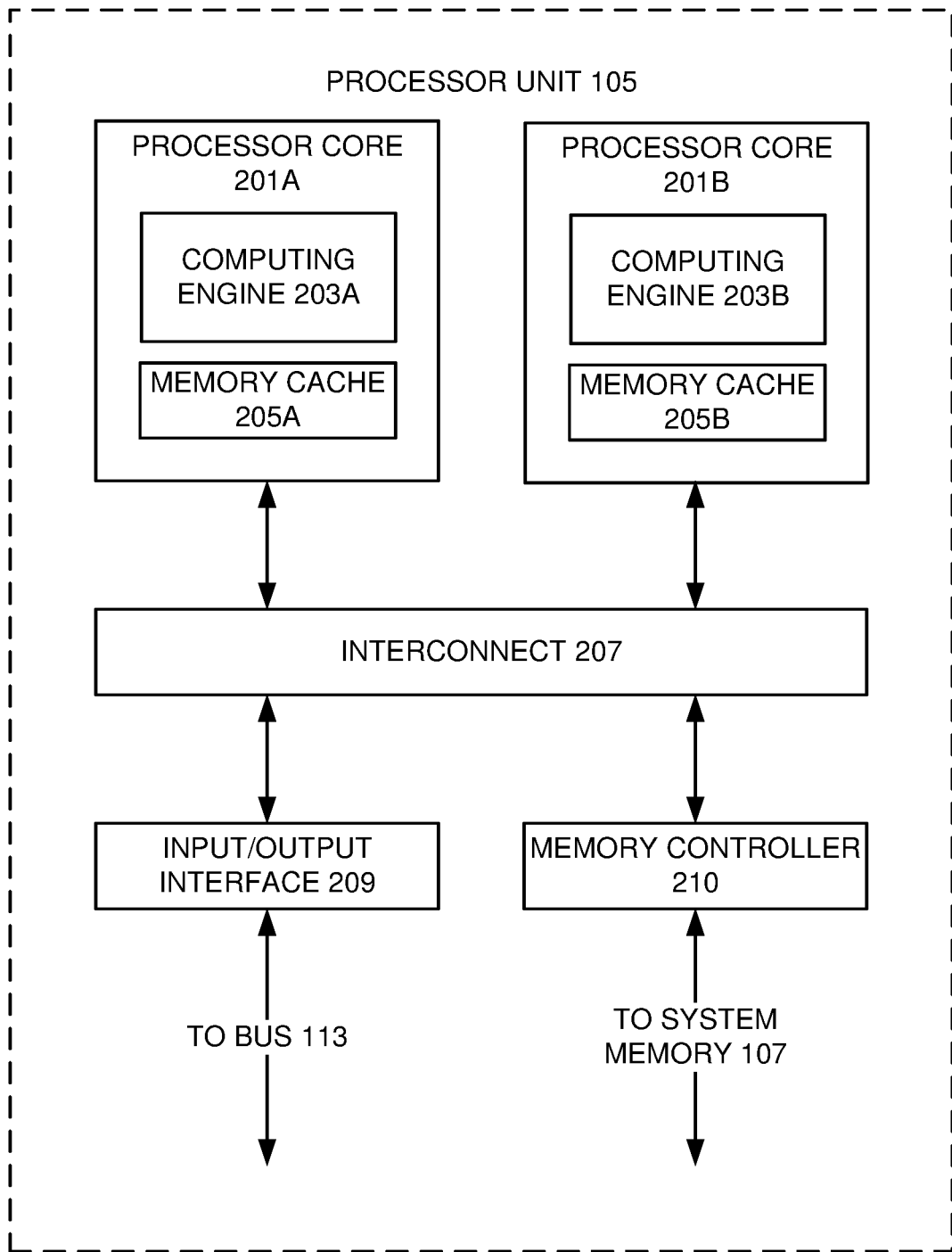

With some implementations, the processor unit 105 can have more than one processor core. Accordingly, FIG. 2 illustrates an example of a multi-core processor unit 105 that may be employed with various embodiments. As seen in this figure, the processor unit 105 includes a plurality of processor cores 201A and 201B. Each processor core 201A and 201B includes a computing engine 203A and 203B, respectively, and a memory cache 205A and 205B, respectively. As known to those of ordinary skill in the art, a computing engine 203A and 203B can include logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203A and 203B may then use its corresponding memory cache 205A and 205B, respectively, to quickly store and retrieve data and/or instructions for execution.

Each processor core 201A and 201B is connected to an interconnect 207. The particular construction of the interconnect 207 may vary depending upon the architecture of the processor unit 105. With some processor cores 201A and 201B, such as the Cell microprocessor created by Sony Corporation, Toshiba Corporation and IBM Corporation, the interconnect 207 may be implemented as an interconnect bus. With other processor units 201A and 201B, however, such as the Opteron™ and Athlon™ dual-core processors available from Advanced Micro Devices of Sunnyvale, Calif., the interconnect 207 may be implemented as a system request interface device. In any case, the processor cores 201A and 201B communicate through the interconnect 207 with an input/output interface 209 and a memory controller 210. The input/output interface 209 provides a communication interface to the bus 113. Similarly, the memory controller 210 controls the exchange of information to the system memory 107. With some implementations, the processor unit 105 may include additional components, such as a high-level cache memory accessible shared by the processor cores 201A and 201B. It also should be appreciated that the description of the computer network illustrated in FIG. 1 and FIG. 2 is provided as an example only, and it not intended to suggest any limitation as to the scope of use or functionality of alternate embodiments.

Functional Safety Synthesis and Verification

Figure 3:
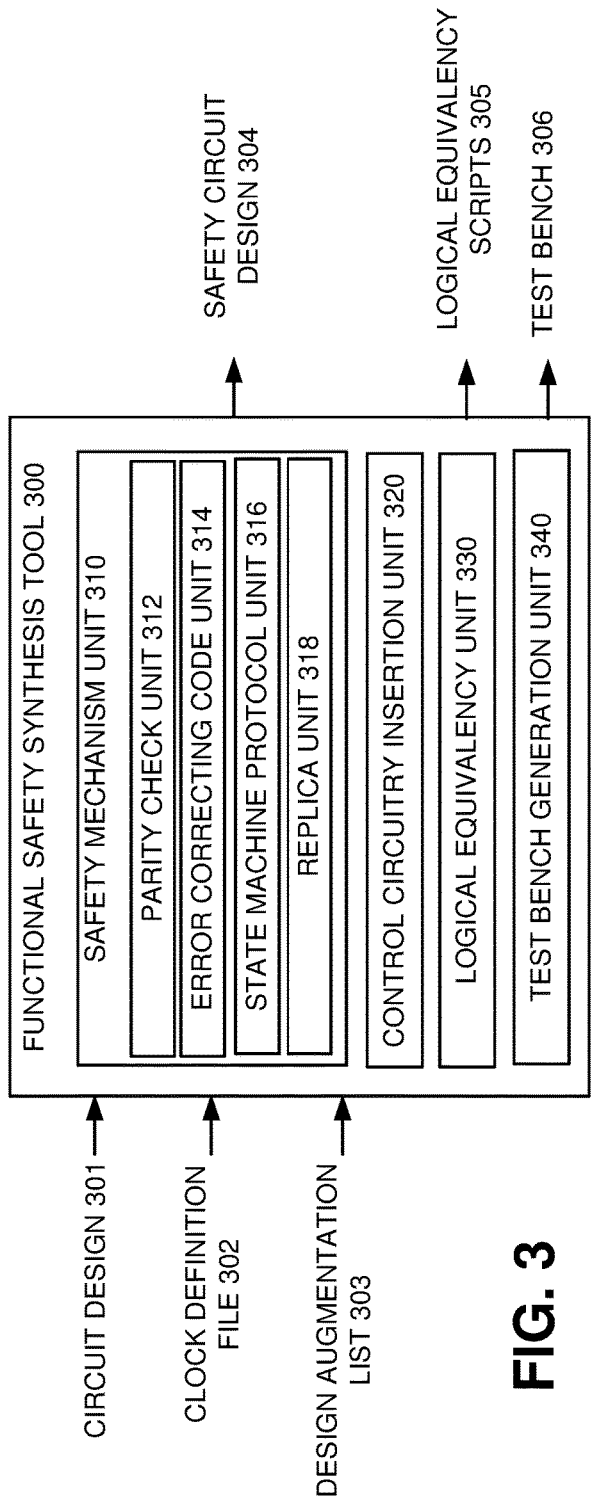
FIG. 3 illustrates an example functional safety synthesis tool, which may be implemented according to various embodiments.
Figure 6:
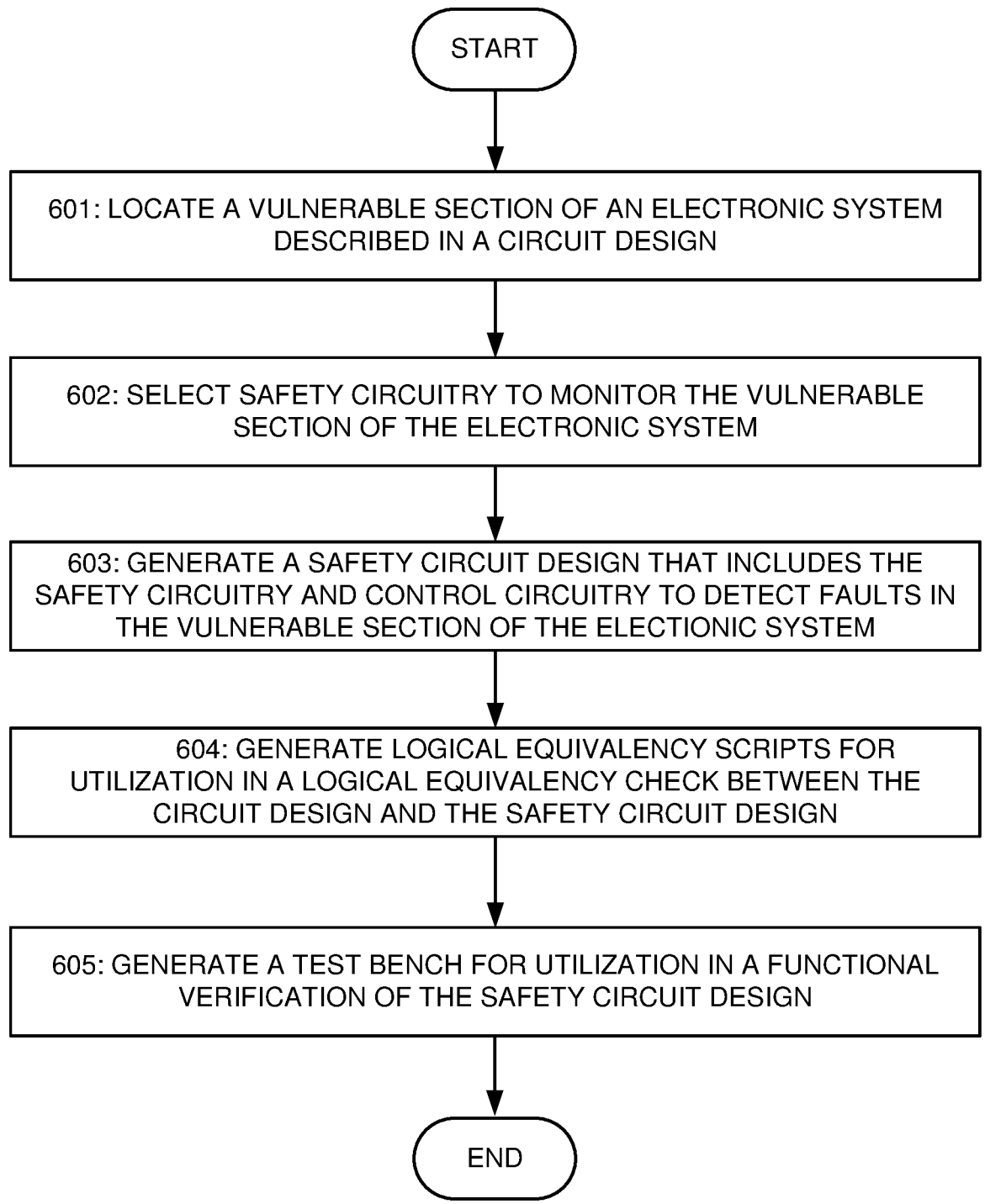
FIG. 6 illustrates an example flowchart implementing functional safety synthesis and verification, which may be implemented according to various embodiments.

FIG. 3 illustrates an example functional safety synthesis tool, which may be implemented according to various embodiments. FIG. 6 illustrates an example flowchart implementing functional safety synthesis and verification, which may be implemented according to various embodiments. Referring to FIGS. 3 and 6, the functional safety synthesis tool 300 can receive a circuit design 301 that describes an electronic device both in terms of an exchange of data signals between components in the electronic device, such as hardware registers, flip-flops, combinational logic, or the like, and in terms of logical operations that can be performed on the data signals in the electronic device. The circuit design 301 can model the electronic device at a register transfer level (RTL), for example, with code in a hardware description language (HDL), such as Very high speed integrated circuit Hardware Design Language (VHDL), System C, or the like. In some embodiments, the safety synthesis tool 300 can receive the circuit design 301 from a source external to the safety synthesis tool 300, such as a user interface of the computer network 101, another tool implemented by the computer network 101, or the safety synthesis tool 300 may generate the circuit design 301 internally.

The safety synthesis tool 300, in some embodiments, can receive a clock definition file 302 and/or a design augmentation list 303. The clock definition file 302 can include a description of the clock signals, clock domains, or the like, associated with the circuit design 301. The design augmentation list 303 can identify one or more portions of or locations in the circuit design 301 that can have security circuitry inserted or that can be excluded from insertion of the security circuitry. In some embodiments, the safety synthesis tool 300 can receive the clock definition file 302 and/or a design augmentation list 303 from a source external to the safety synthesis tool 300, such as a user interface of the computer network 101, another tool implemented by the computer network 101, or the safety synthesis tool 300 may generate the clock definition file 302 and/or a design augmentation list 303 internally.

The safety synthesis tool 300 can modify the circuit design 301 to include safety circuitry, for example, that generates a safety circuit design 304. The safety circuitry in the safety circuit design 304 can detect faults in the logic of the circuit design 301 and issue alerts corresponding to the detected faults. In some embodiments, the safety circuitry also can remedy any errors caused by the detected faults.

The safety synthesis tool 300 also can perform verification operations on the safety circuit design 304, for example, to verify a logical equivalence of the safety circuit design 304 to the circuit design 301, and to functionally verify the safety circuitry and control circuitry in the safety circuit design 304 operate as expected. The safety synthesis tool 300 generate logical equivalency scripts 305 for utilization in a logical equivalency check between the circuit design 301 and the safety circuit design 304. The safety synthesis tool 300 can generate a test bench 306 for utilization in a functional verification of the safety circuit design 304, such as a simulation or emulation of the safety circuit design 304 in a verification environment. Embodiments of a verification environment will be described below with reference to FIG. 7.

The safety synthesis tool 300 can include a safety mechanism unit 310, which in block 601 of FIG. 6, can locate a vulnerable section of the electronic system described in a circuit design 301. In some embodiments, the safety mechanism 310 can identify the vulnerable section of the electronic system from the design augmentation list 303, which can include a list of elements in the circuit design 301 to protect with security circuitry. The safety mechanism unit 310 also can analyze the circuit design 301 to identify circuitry, such as memory devices, state machines, flip-flops, groups of flip-flops, cones of logic for flip-flops, or the like, to protect with security circuitry.

In a block 602, the safety mechanism unit 310 can select safety circuitry to detect a fault in the vulnerable section of the electronic system. In some embodiments, the safety mechanism unit 310 can select the safety circuitry based on a location of the vulnerable section of the electronic system, the types of circuitry or logic to protect within the circuit design, or the like. For example, when safety mechanism unit 310 identifies a vulnerable section of the electronic system corresponds to a state machine, the safety mechanism unit 310 can select state machine protocol checking circuitry as the safety circuitry and/or select to duplicate or triplicate elements of the state machine with safety circuitry.

The safety mechanism unit 310 can include a parity check unit 312 to modify the circuit design 301 to include parity generation and check circuitry. The parity generation and check circuitry can perform parity generation, such as adding parity bit(s) to data transmitted in the circuit design 301. The parity generation and check circuitry also can utilize the added parity bits to check the transmitted data for possible transmission errors.

In some embodiments, the parity check unit 312 can automatically insert parity generation and check circuitry corresponding to all possible flip-flops in the circuit design 301. The parity check unit 312 also can insert parity generation and check circuitry for a subset of the flip-flops in the circuit design 301, for example, those flip-flops identified in the design augmentation list 303.

In an effort to avoid the generation of false parity errors during run time, the parity check unit 312 can analyze the circuit design 301 to identify one or more safe groupings of flip-flops, for example, based on the clock definition file 302. The parity check unit 312 can utilize the safe groupings of the flip-flops to generate the correct parity for the safe grouping. In some embodiments, the parity check unit 312 can set a maximum width of the parity to be generated, for example, to limit a timing impact corresponding to the generated parity bits, and the parity check unit 312 can insert parity generation and check circuitry based, at least in part, on the width of the parity generated.

The safety mechanism unit 310 can include an error correcting code unit 314 to modify the circuit design 301 to include security circuitry to generate error-correcting codes and to utilize the error-correcting codes to detect and correct bit-flip errors in portions of the circuit design 301, such as memory devices. In some embodiments, the error correcting code unit 314 can utilize security circuitry configured to implement single error correct with double error detect (SECDED) for a bank of registers in the circuit design 301. For example, the error correcting code unit 314 can group registers and add security circuitry implementing an error correcting code by creating a syndrome, adding additional registers to store the syndrome, using the syndrome to perform error detection and correction on the outputs of the registers based on the error correcting code.

The safety mechanism unit 310 can include a state machine protocol unit 316 to detect a state machine in the circuit design 301, for example, utilizing a heuristic technique that can identify potential state machines and isolate them from other portions of the circuit design 301. The state machine protocol unit 316 can elaborate the state machine by identifying a valid state space of the state machine and generating a transition matrix to identify how the circuitry corresponding to the state machine transitions between states.

The state machine protocol unit 316 can utilize the valid state space of the state machine and the transition matrix to insert security circuitry into the circuit design 301 capable of checking the protocol of the state machine. For example, the security circuitry can identify when the state machine entered an invalid state or when the state machine made a transition between states that was not allowed. The state machine protocol unit 316 also can identify whether the state machine should be replicated in the circuit design 301, for example, duplicated or triplicated in the circuit design 301 with security circuitry.

The safety mechanism unit 310 can include a replica check unit 318 to modify the circuit design 301 by duplicating or triplicating portions of the circuit design 301. The duplication or triplication of portions of the circuit design 301 can allow security circuitry to identify when the portions of the circuit design 301 undergo a fault, and in some embodiments, to correct the fault with the values of the duplicated or triplication circuitry.

The safety synthesis tool 300 can include a control circuitry insertion unit 320 control circuitry configured to control operations of the safety circuitry inserted by the safety mechanism unit 310. The control circuitry can communicate with the safety circuitry inserted into the circuit design 301. In some embodiments, the security circuitry can communicate directly with the control circuitry, while, in other embodiments, the control circuitry communicates with the safety circuitry via reporting circuitry.

The security circuitry can detect faults in the circuit design 301 and send an indication of the fault detection, such as an error message, to the control circuitry. The control circuitry also can send messages to the security circuitry, such as an enablement signal, a clear or reset signal, or an inject signal. The enablement signal can allow the control circuitry to enable the security circuitry. The clear or reset signal can prompt the security circuitry to reset itself to an initial state. The inject signal can allow the control circuitry to inject a fault into the security circuitry, which can be utilized to detect whether the security circuitry can detect faults during subsequent verification operations.

In a block 603, the safety mechanism unit 310 and the control circuitry insertion unit 320 can generate a safety circuit design that includes the safety circuitry and control circuitry to control operations of the safety circuitry. Embodiments of the generation of the safety circuit design will be described with reference to FIGS. 4A and 4B in greater detail.

Figure 4A:
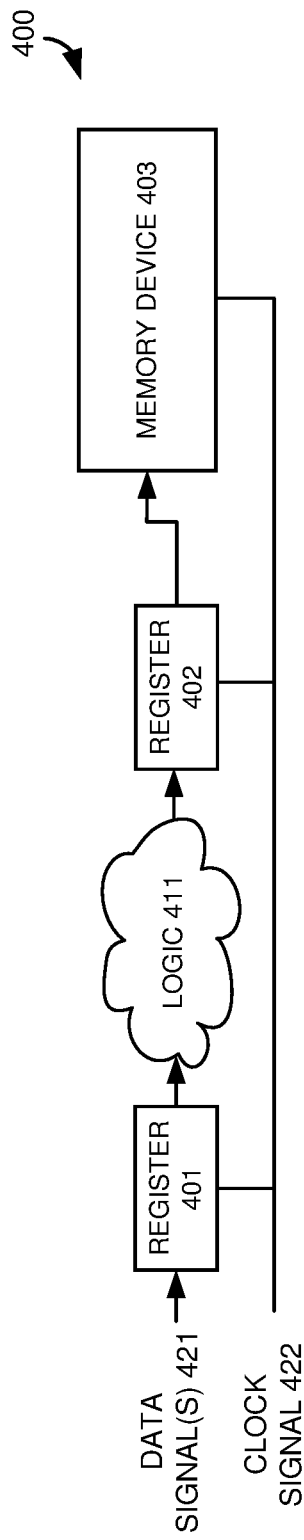
FIGS. 4A and 4B illustrate example synthesis of functional safety circuitry for an integrated circuit design, which may be implemented according to various embodiments.
Figure 4B:
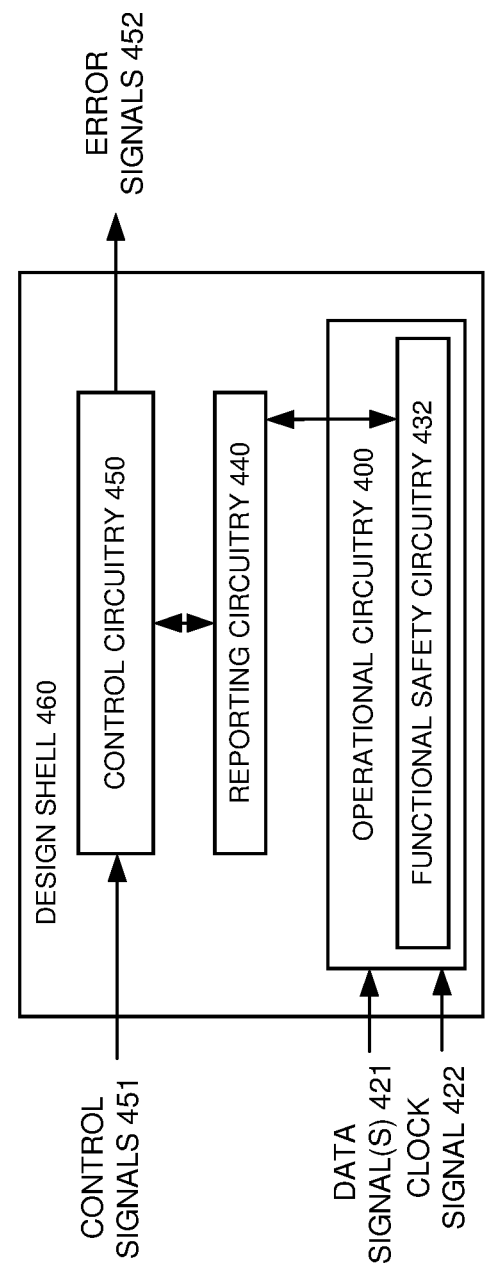

FIGS. 4A and 4B illustrate example synthesis of functional safety circuitry in an integrated circuit design, which may be implemented according to various embodiments. Referring to FIG. 4A, operational circuitry 400 described in an integrated circuit design can receive data signals 421 and clock signals 422, which can be propagated through stages to a memory device 403, such as a static random access memory (SRAM) device. In the instant example, the operation circuitry 400 includes multiple registers 401 and 402 to latch the data signals 421 in response to the clock signal 422. The operational circuitry 400 can include combinational logic, such as logic 411, coupled between the registers 401 and 402.

In a first stage of the operational circuitry 400, the register 401 can be configured to latch the data signals 421 in response to a rising edge of the clock signal 422 and allow the data signals 421 to propagate through the logic 411 to the register 402. In a second stage of the logic pipeline 400, the register 402 can be configured to latch data signals from the logic 411 in response to a rising edge of the clock signal 422 and allow the latched data signals to propagate to the memory device 403.

Referring to FIG. 4B, a functional safety synthesis tool can insert functional safety circuitry 432 into the integrated circuit design, which can identify faults in the operational circuitry 400. The functional safety circuitry 432 can include a logic circuitry configured to check the operational circuitry 400 for one or more types of faults. For example, the functional safety circuitry 432 can perform parity generation, such as adding parity bit(s) to data in the operational circuitry 400, and checks the data having the added parity bits for possible transmission errors. The functional safety circuitry 432 can perform error-correcting code (ECC) generation, such as adding redundant data to a message transmitted in the operational circuitry 400, and checks the transmitted message for possible transmission errors based on the ECC data added to the message. The functional safety circuitry 432 can perform state machine protocol checks, for example, by monitoring state transitions of a state machine to determine whether a state machine in the operational circuitry 400 entered an invalid state or made an invalid transition between states. The functional safety circuitry 432 can replicate portions of the operational circuitry 400 and utilize the outputs of the operational circuitry 400 and the replicas to detect faults.

The functional safety synthesis tool can generate a design shell 460, which encapsulates the operational circuitry 400 having the functional safety circuitry 432. The functional safety synthesis tool can insert reporting circuitry 440 and/or control circuitry 450 in design shell 460. The reporting circuitry 440 can receive output from the functional safety circuitry 432, such as an outcome of a check on the operation circuitry 400, and generate an error report for the control circuitry 450. The control circuitry 450 can utilize the error report from the reporting circuitry 440 to generate error signals 452, which can be output from the design shell. The control circuitry 400 can receive control signals 551, which can control the operation of the reporting circuitry 440 and/or the functional safety circuitry 432. In some embodiments, the control signals 451 can prompt the control circuitry 450 to direct the reporting circuitry 440 and/or the functional safety circuitry 432 to become enabled, to clear or reset their values, inject a fault in the operational circuitry 400, or the like. The control circuitry 450 and/or the reporting circuitry 440 can include alarm logic that, during a fault injection campaign, can identify when a fault was introduced into the operational circuitry 400, which can improve a diagnostic coverage of the integrated circuit design.

Referring back to FIGS. 3 and 6, the control circuitry insertion unit 320 can configure the control circuitry to include alarm logic, which can receive the error messages from the security circuitry in the circuit design 301 and generate error signals that indicate the security circuitry detected a fault. In some embodiments, the alarm logic can include redundancy configurations, for example, to provide temporal or spatial redundancy in the generation of the error signal from the error massages received from the security circuitry in the circuit design 301. Embodiments of control circuitry configurations will be described with reference to FIGS. 5A and 5B in greater detail.

FIGS. 5A and 5B illustrate example redundancy configurations for safety circuitry, which may be implemented according to various embodiments. Referring to FIG. 5A, safety circuitry 500 can implement an alarm circuitry having a temporal redundancy configuration. The safety circuitry 500 can receive an error check signal 501 from reporting circuitry or from embedded functional safety circuitry in a circuitry design. The error check signal 501 can indicate whether the embedded functional safety circuitry in the circuitry design detected a fault in a check, such as a parity check, an ECC check, a state machine protocol check, a replica check, or the like. The safety circuitry 500 can output an error signal 506 based on a state of the error check signal 501 over multiple clock periods.

The safety circuitry 500 can include an OR gate 502 to receive the error check signal 501 as well as feedback signals from the outputs of registers 503 and 505. The register 503 can latch the output of the OR gate 502, for example, based on an edge of a clock signal, and provide the latched data to an OR gate 504 and to the input of the OR gate 502. The OR gate 504 also can receive a feedback signal from the output the register 505. The register 505 can latch the output of the OR gate 504, for example, based on the edge of the clock signal, and output the latched data as the error signal 506. The register 505 also can output the latched data as input to both of the OR gates 502 and 504.

Referring to FIG. 5B, safety circuitry 510 can implement an alarm circuitry having a spatial redundancy configuration. The safety circuitry 510 can receive an error check signal 511 from reporting circuitry or from embedded functional safety circuitry in a circuitry design. The error check signal 511 can indicate whether the embedded functional safety circuitry in the circuitry design detected a fault in a check, such as a parity check, an ECC check, a state machine protocol check, a replica check, or the like. The safety circuitry 510 can output an error signal 516 based on a state of the error check signal 511.

The safety circuitry 510 can include an OR gate 512 to receive the error check signal 511 as well as a feedback signal from the output of a register 513. The register 513 can latch the output of the OR gate 512, for example, based on an edge of a clock signal, and output the latched data. The register 513 can provide the latched data as input to the OR gate 512. The safety circuitry 510 can include an OR gate 514 to receive an inversion of the error check signal 511, for example, an inverter gate 517 can invert the error check signal 511 and provide the inverted error check signal 511 to the OR gate 514. A register 515 can latch the output of the OR gate 514, for example, based on the edge of the clock signal, and output the latched data. The register 515 can provide the latched data as input to the OR gate 514. The output of the registers 513 and 515 can be combined to form the error signal 516.

Referring back to FIGS. 3 and 6, the safety synthesis tool 300 includes a logical equivalency unit 330, which in block 604 of FIG. 6, can generate logical equivalency scripts 305 for utilization in a logical equivalency check between the circuit design 301 and the safety circuit design 304. The logical equivalency scripts 305 can include sequential equivalency check (SEC) scripts or logical equivalency check (LEC) scripts to direct a formal equivalency check tool to analyze the circuit design 301 and the safety circuit design 304 and determine an equivalence between the circuit design 301 and the safety circuit design 304.

The safety synthesis tool 300 includes a test bench generation unit 340, which in block 605 of FIG. 6, can generate a test bench 306 for utilization in a functional verification of the safety circuit design 304. The test bench 306, during simulation or emulation, can generate test stimulus, for example, clock signals, activation signals, power signals, control signals, and data signals that, when grouped, may form test bench transactions capable of prompting operation of the safety circuit design 304 in a verification environment. In some embodiments, the test bench 306 can be written in an object-oriented programming language, for example, SystemVerilog or the like, which, when executed during elaboration, can dynamically generate test bench components for verification of the safety circuit design 304. A methodology library, for example, a Universal Verification Methodology (UVM) library, an Open Verification Methodology (OVM) library, an Advanced Verification Methodology (AVM) library, a Verification Methodology Manual (VMM) library, or the like, can be utilized as a base for creating the test bench 306. The safety circuit design 304, in response to the test stimuli in the verification environment, can generate output, which can be compared to an expected output of the security circuitry in the safety circuit design to ensure the added safety circuitry to the safety circuit design 304 performs as expected.

Example Verification Environment

Figure 7:
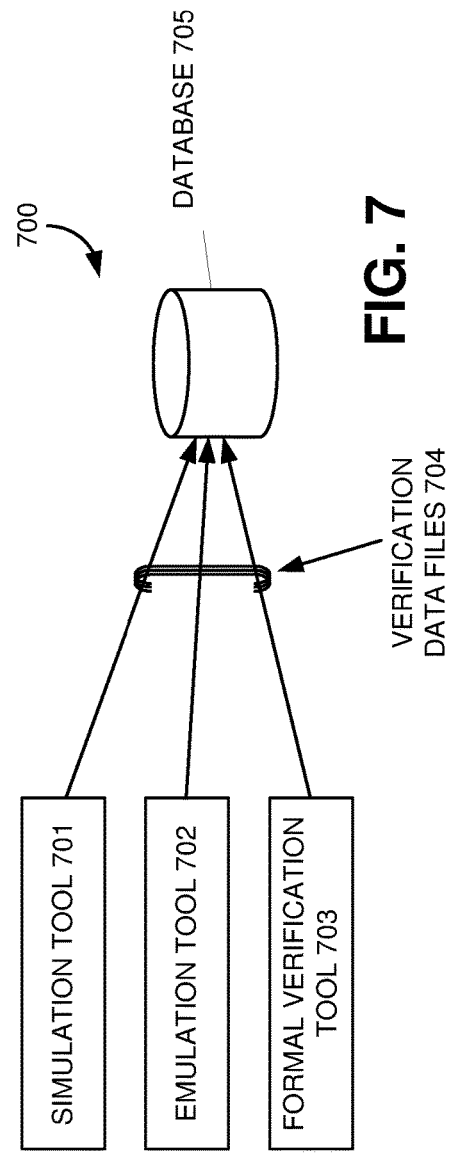
FIG. 7 illustrate an example verification system generated verification data from multiple verification tools that may be implemented according to various embodiments.

FIG. 7 illustrate an example verification system 700 with multiple verification tools that may be implemented according to various embodiments. Referring to FIG. 7, the verification data system 700 can include multiple verification tools, such as a simulation tool 701, an emulation tool 702, a formal verification tool 703, or the like, to functionally verify an electronic design described by a circuit design with inserted functional safety circuitry. The verification tools can generate verification data files 704 for storage in a database 705. In some embodiments, the verification data files 704 can include a Value Change Dump (VCD) file, for example, in an ASCII-based format.

The simulation tool 701 and the emulation tool 702 can respectively simulate or emulate a test bench and a design under verification, such as the circuit design, and generate the verification data files 704. Both the test bench and the design under verification can be generated by a functional safety synthesis tool, such as the functional safety synthesis tool 300 described above in FIG. 3 generation of the safety circuit design 304 and the test bench 306. The emulation tool 702 can perform functional verification with one or more hardware emulators configured to emulate the design under verification. The simulation tool 701 can implement the design verification tool with one or more processors configured to simulate the design under verification.

The test bench, during simulation or emulation, can generate test stimulus, for example, clock signals, activation signals, power signals, control signals, and data signals that, when grouped, may form test bench transactions capable of prompting operation of the design under verification. In some embodiments, the test bench can be written in an object-oriented programming language, for example, SystemVerilog or the like, which, when executed during elaboration, can dynamically generate test bench components for verification of the circuit design. A methodology library, for example, a Universal Verification Methodology (UVM) library, an Open Verification Methodology (OVM) library, an Advanced Verification Methodology (AVM) library, a Verification Methodology Manual (VMM) library, or the like, can be utilized as a base for creating the test bench. The simulated or emulated design under verification, in response to the test stimuli, can generate output, which can be compared to expected output of the design under verification in response to the test stimuli by the simulation tool 701 or the emulation tool 702.

The formal verification tool 703 can analyze the circuit design in an attempt to functionally verify portions of the circuit design. In some embodiments, the formal verification tool 703 can utilize one or more formal techniques, such as a Binary Decision Diagram (BDD), a Boolean Satisfiability (SAT) Solver, an Automatic Test Pattern Generator (ATPG), Cut Point Prover, or the like, in an attempt to prove or disprove functionality of circuit design. The formal verification tool 703 also can utilize static design checking functionality, such as a clock domain crossing check, a reset domain check, a power domain check, or the like, which can be utilized in an attempt to functionally verify portions of the circuit design.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments, those skilled in the art will appreciate that there are numerous variations and permutations of the above described systems and techniques that fall within the spirit and scope of the invention as set forth in the appended claims. For example, while some of the specific terminology has been employed above to refer to electronic design automation processes, it should be appreciated that various examples may be implemented using any electronic system.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
   locating, by a computing system, a vulnerable section of an electronic system described in a circuit design;
   selecting, by the computing system, safety circuitry configured to monitor the vulnerable section of the electronic system;
   modifying, by the computing system, the circuit design by inserting the safety circuitry and control circuitry into the circuit design, wherein the control circuitry and the safety circuitry are configured to detect faults in the vulnerable section of the electronic system; and
   generating, by the computing system, a shell module for the modified circuit design, which encapsulates the safety circuitry, the control circuitry, and the vulnerable section of the electronic system.

2. The method of claim 1, further comprising:
   generating, by the computing system, a logical equivalency check script for the modified circuit design; and
   utilizing, by the computing system, the logical equivalency check script to determine whether the modified circuit design is logically equivalent to the circuit design.

3. The method of claim 1, further comprising:
   generating, by the computing system, a test bench for the modified circuit design; and
   simulating, by the computing system in a verification environment, the modified circuit design and the test bench, wherein the test bench provides test stimulus to the modified circuit design in the verification environment.

4. The method of claim 1, wherein the control circuitry further comprises alarm circuitry having temporal redundancy or spatial redundancy.

5. The method of claim 1, wherein the safety circuitry is configured to perform at least one of: a parity check, a state machine protocol check, or an error-correcting code check, which detects the faults in the vulnerable section of the electronic system.

6. The method of claim 1, wherein the safety circuitry corresponds to at least one replica of circuitry described in the circuit design, and wherein the at least one replica of the circuitry, when coupled to the electronic system, is configured to protect against a possible failure of the vulnerable section in the electronic system.

7. An apparatus comprising at least one computer-readable memory device storing instructions configured to cause one or more processing devices to perform operations comprising:
   locating a vulnerable section of an electronic system described in a circuit design;
   selecting safety circuitry configured to monitor the vulnerable section of the electronic system; and
   modifying the circuit design by inserting the safety circuitry and control circuitry into the circuit design, wherein the control circuitry further comprises alarm circuitry having temporal redundancy or spatial redundancy, and wherein the control circuitry and the safety circuitry are configured to detect faults in the vulnerable section of the electronic system.

8. The apparatus of claim 7, wherein the instructions are configured to cause one or more processing devices to perform operations further comprising generating a shell module for the modified circuit design, which encapsulates the safety circuitry, the control circuitry, and the vulnerable section of the electronic system.

9. The apparatus of claim 7, wherein the instructions are configured to cause one or more processing devices to perform operations further comprising:
   generating a logical equivalency check script for the modified circuit design; and
   utilizing the logical equivalency check script to determine whether the modified circuit design is logically equivalent to the circuit design.

10. The apparatus of claim 7, wherein the instructions are configured to cause one or more processing devices to perform operations further comprising:
   generating a test bench for the modified circuit design; and
   simulating, in a verification environment, the modified circuit design and the test bench, wherein the test bench provides test stimulus to the modified circuit design in the verification environment.

11. The apparatus of claim 7, wherein the safety circuitry is configured to perform at least one of a parity check, a state machine protocol check, or an error-correcting code check, which detects the faults in the vulnerable section of the electronic system.

12. The apparatus of claim 7, wherein the safety circuitry corresponds to at least one replica of circuitry described in the circuit design, and wherein the at least one replica of the circuitry, when coupled to the electronic system, is configured to protect against a possible failure of the vulnerable section in the electronic system.

13. A system comprising:
   a memory system configured to store computer-executable instructions; and
   a computing system, in response to execution of the computer-executable instructions, is configured to:
      locate a vulnerable section of an electronic system described in a circuit design;
      select safety circuitry configured to monitor the vulnerable section of the electronic system; and
      modify the circuit design by inserting the safety circuitry and control circuitry into the circuit design, wherein the safety circuitry is configured to perform at least one of: a parity check, a state machine protocol check, or an error-correcting code check on the vulnerable section of the electronic system, and wherein the control circuitry and the safety circuitry are configured to detect faults in the vulnerable section of the electronic system.

14. The system of claim 13, wherein the computing system, in response to execution of the computer-executable instructions, is further configured to generate a shell module for the modified circuit design, which encapsulates the safety circuitry, the control circuitry, and the vulnerable section of the electronic system.

15. The system of claim 13, wherein the computing system, in response to execution of the computer-executable instructions, is further configured to:
   generate a logical equivalency check script for the modified circuit design; and
   utilize the logical equivalency check script to determine whether the modified circuit design is logically equivalent to the circuit design.

16. The system of claim 13, wherein the computing system, in response to execution of the computer-executable instructions, is further configured to:
   generate a test bench for the modified circuit design; and
   simulate, in a verification environment, the modified circuit design and the test bench, wherein the test bench provides test stimulus to the modified circuit design in the verification environment.

17. The system of claim 13, wherein the safety circuitry corresponds to at least one replica of circuitry described in the circuit design, and wherein the at least one replica of the circuitry, when coupled to the electronic system, is configured to protect against a possible failure of the vulnerable section in the electronic system.

* * * * *